United States Patent

Nechansky

[11] Patent Number: 5,819,858
[45] Date of Patent: Oct. 13, 1998

[54] CIRCUIT BOARD HAVING A METAL MATRIX COMPOSITE INLAY

[75] Inventor: Helmut Nechansky, Vienna, Austria

[73] Assignee: Electrovac, Fabrikation elektrotechnischer Spezialartikel Gesellschaft m.b.H., Klosterneuburg, Austria

[21] Appl. No.: 415,078

[22] Filed: Mar. 30, 1995

[30] Foreign Application Priority Data

Mar. 30, 1994 [AT] Austria ........................................ 680/94

[51] Int. Cl.$^6$ .................................................. H05K 1/00
[52] U.S. Cl. ........................ 174/252; 174/250; 174/260
[58] Field of Search .................................. 174/252, 255, 174/261, 250, 52.4; 361/761, 708, 719, 720, 721, 762, 777; 257/712, 713, 717, 700

[56] References Cited

U.S. PATENT DOCUMENTS

| | | | |
|---|---|---|---|
| 3,710,196 | 1/1973 | Fifield | 174/261 X |
| 3,739,614 | 6/1973 | Cranston . | |
| 3,770,529 | 11/1973 | Anderson . | |
| 4,532,152 | 7/1985 | Elarde . | |
| 4,806,704 | 2/1989 | Belke, Jr. et al. | 174/52.4 |
| 5,241,456 | 8/1993 | Marcinkiewicz et al. | 361/761 X |
| 5,258,887 | 11/1993 | Fortune | 361/720 |
| 5,297,006 | 3/1994 | Mizukoshi | 257/713 X |
| 5,402,004 | 3/1995 | Ozmat | 257/717 |
| 5,506,755 | 4/1996 | Miyagi et al. | 361/720 |

FOREIGN PATENT DOCUMENTS

| | | |
|---|---|---|
| 0 051 378 | 5/1982 | European Pat. Off. . |
| 0 115 158 | 8/1984 | European Pat. Off. . |
| 1 081 619 | 5/1960 | Germany . |
| 35 42 889 | 6/1986 | Germany . |
| 267172 | 3/1927 | United Kingdom . |
| 515354 | 12/1939 | United Kingdom . |
| 639179 | 6/1950 | United Kingdom . |
| 2 033 667 | 5/1980 | United Kingdom . |

OTHER PUBLICATIONS

Patent Abstracts of Japan, vol. 11 No. 73 (–486), Mar. 5, 1987 & JP–A–61 230343 (Matsushita Electric Ind Co) Oct. 14, 1986.

Primary Examiner—Kristine L. Kincaid
Assistant Examiner—Kristina Soderquist
Attorney, Agent, or Firm—Henry M. Feiereisen

[57] ABSTRACT

A circuit board includes a substrate of ceramic material and conductive strips in form of a metal layer which is cast onto the surface of the substrate and formed through locally stripping metal layer from the substrate surface. The circuit board further includes a recess for receiving an inlay of metal matrix composite material.

16 Claims, 3 Drawing Sheets

CIRCUIT BOARD HAVING A METAL MATRIX COMPOSITE INLAY

BACKGROUND OF THE INVENTION

The present invention refers to circuit board, and in a particular to a circuit board of a type having a substrate of ceramics, with metallic conductive strips formed upon its surface. The present invention refers further to a method for making a circuit board, especially a chip casing, with the substrate forming an electrically insulating base for a chip, whereby conductive metal strips are formed on the surface of the substrate for supplying electric energy to the chip, and the interior of the substrate has metal bridges for absorbing heat formed by the chip.

Circuit boards with metallic conductive strips formed on the surface of a substrate are frequently used and known in the prior art. The conductive strips are generally applied on the ceramic substrate through a type of screen printing, with an electrically conducting screen printing paste being used. Conductive strips produced in this manner show frequently quality defects as the adhesion of the conductive strips upon the substrate is unsatisfactory.

SUMMARY OF THE INVENTION

It is an object of the present invention to provide an improved circuit board, obviating the afore-stated drawbacks.

It is another object of the present invention to provide an improved method for making a circuit board.

These objects and others which will become apparent herein after are attained in accordance with the present invention by providing a substrate of ceramics, with fusible metallic conductive strips being cast onto the surface of the substrate.

By casting fusible metal onto the surface of the ceramic substrate, the quality of the circuit board is significantly improved as the conductive strips are bonded tighter to the surface of the substrate and thus adhere better compared to conventional screen printing processes, as evidenced also by micrograph tests of finished structures.

The process of simply casting with metal to form the conductive strips is however appropriate in only few cases because the conductive strips are frequently of very fine structure and must be placed closely in form of a spider web. This can be accomplished only in a very difficult manner through simple casting. Accordingly, in accordance with another feature of the present invention, the ceramic substrate is provided with grooved depressions for formation of the conductive strips. Through embedding the conductive strips in grooves, their adhesion to the ceramic substrate is ensured in a superior manner.

According to another feature of the present invention, the ceramic substrate may be connected with a structural member of metal and/or metal matrix composite (MMC) material. This combination improves the heat transfer so that even higher power dissipation encountered on the ceramic substrate can be easily absorbed. Suitably, at least one lateral edge of the substrate is kept free from metal and/or MMC-material over at least some areas. This is in particular advantageous when the circuit board should be formed with an insulating base area.

In accordance with the present invention a method for making a circuit board according to the invention includes the steps of casting a substrate of ceramics, possibly together with a preform of porous ceramics or of a reinforcement of a MMC material and/or together with a structure of MMC material and/or metal, with metal suitable for making the conductive strips, and locally removing portions of the formed metal layer from the substrate surface to shape the conductive strips.

Preferably, the surface of the substrate to form the conductive strips is stripped by a photolithographic-type method, by etching, burning off or laser treatment. In this manner, the required very thin textures can be produced with a very dense network of conductive strips.

The production of such circuit boards can be carried out in ceramic substrates with grooved depressions, by casting the substrate with metal and stripping the substrate surface to leave only the metal filling in the depressions until the metal filling in the depressions is flush with the surface of the substrate. Thus, only the depressions are filled with metal to thereby form the conductive strips, and since being set back with regard to the substrate surface, the metal filling bonds in a superior manner with the ceramic substrate.

In a further development of the present invention, it has been shown that this method can also be used in an highly advantageous manner for making chip casings. Chip casings for use in the electronic field are described e.g. in International patent application PCT 91/13462 of Lanxide Technology Corporation. These known casings are made of a macrocomposite which is formed through spontaneous infiltration of a particulate filling material with a fusible matrix metal and simultaneous bonding of the forming product to a second component, preferably an insulator. The filling material is prepared as such or as a preform in a mold. This filling material is a particulate or porous mass to enable a permeation of metal, and may be made of i.a. ceramic material or a material covered with ceramics. Fillers bonded with metal are known and are called matrix metal composite (MMC). MMC-material is used in manufacturing chip casings as heat-absorbing material in order to absorb heat developed by the chip.

U.S. Pat. No. 5,039,577 describes a base structure with a double layer containing a reinforcement with particulate material, on the one hand, and graphite fibers, on the other hand. The thermal conductivity, elasticity and thermal properties of the double layer can be modified through variations of these reinforcing materials.

European Patent No. EP 0 471 552 describes a chip casing, with a base plate containing a passageway for coolant. The flowing coolant improves the absorption of excessive heat compared to the material alone.

The present invention is based on the further development of improved circuit boards in form of chip casings, which include a ceramic substrate with an electrically insulating attachment for the chip, metallic conductive strips for supplying electric energy to the chip, and possibly inner metal bridges for absorbing heat generated by the chip. The manufacture of a chip casing based on a circuit board in accordance with the present invention is characterized by a ceramic substrate of densely baked ceramic material with continuous, in particular tubular shaped, metal-filled passageways, with the conductive strips being formed from a cast metal layer. A chip casing according to the invention has an improved heat distribution or heat conduction via the continuous passageways in a preselected manner and effects a superior bond of the conductive strips. Moreover, the metal-filled passageways may also be usable as electrical lines, in particular connection lines which extend through the ceramic substrate.

A chip casing based upon a circuit board according the present invention is made by using a densely baked ceramic substrate which contains bores or e.g. tubular passageways, and casting the ceramic substrate simultaneously with metal for filling the passageways. The required conductive strips are then formed through locally removing the metal layer from the substrate surface.

Preferably, the bores or tubular passageways have a diameter in the range of tenths of millimeters, with the webs therebetween having a width of preferably about 0.5 mm. The bores are attached while the ceramic mass is still in the state of the unbaked "green tape", i.e. before the ceramic mass is finally baked. Suitably, the metallic conductive strips may be provided in grooved depressions of the ceramic substrate, as described above.

In order to prepare an insulated area for attachment of the chip, the surface of the substrate is stripped of metal such that the arrangement of the passageways in the ceramic substrate leaves sufficient space of densely baked ceramic for the chip. Alternatively, a separate insulator plate may be placed on the ceramic substrate provided with metal bridges.

In accordance with a preferred embodiment of the invention, the ceramic substrate is provided on one side distant to the chip with a first recess for receiving an inlay of metal and/or metal matrix composite (MMC) material to thereby further improve the heat absorption. A second recess in the ceramic substrate may be provided to receive the chip. Preferably, the first recess includes an annular inlay of MMC-material. In case, the heat absorption is still not sufficient, the MMC inlay and possibly the metal envelope thereof may be provided with cooling channels for a coolant, with air or cooling liquids being used as coolant.

In some instances it may be suitable to provide a multi-layer substrate, with the tubular passageways partly extending in the plane of the substrate and/or at least partially vertical thereto. The ceramic substrate composed of several layers is advantageous for coping with a great number of intersecting connecting lines in one plane.

According to another feature of the present invention, at least one edge area of the substrate is provided with a groove or step which is filled with metal during metal casting in order to enable a welding of the casing with a lid. Thus, no separate production step is necessary for forming such a connection groove.

The casting with metal can be carried out with or without application of pressure. The application of pressure is suitable, in particular when the substrate is made of porous ceramics which should be infiltrated with metal at least in certain areas thereof. When using e.g. silicon carbide, pressure in the range of 100–140 bar has proved particularly advantageous. A wall thickness of formed metal layers on the surface of the substrate in the range of tenths of millimeter has proven favorable, with the conductive strips preferably being formed through photolithographic methods, etching, burning off or laser treatment, as described above. In case the substrate has grooved depressions, the surface of the substrate after being cast with metal, is stripped such that the metal layer on the surface is removed until the metal filled in the depressions is flush with the surface of the substrate.

In general, the substrate is made of densely baked ceramics whereby the term "densely burned" is supposed to mean "not porous". Examples for ceramics include an oxide ceramics, carbide ceramics and/or nitrate ceramics, e.g. aluminum oxide, aluminum nitrate, or beryllium oxide. Examples for the infiltration metal include aluminum, iron, nickel, cobalt, silicon, copper, molybdenum or alloys thereof. The MMC-material may have as reinforcing material an oxide ceramics, carbide ceramics and/or nitrate ceramics, e.g. silicon carbide, aluminum nitride, beryllium oxide, aluminum oxide, boron nitrate or carbon.

A chip casing according to the present invention can advantageously be used for protection of multi-chip modules (MCM).

BRIEF DESCRIPTION OF THE DRAWING

The above and other objects, features and advantages of the present invention will now be described in more detail with reference to the accompanying drawing in which.

DETAILED DESCRIPTION OF PREFERRED EMBODIMENTS

Figure 1:
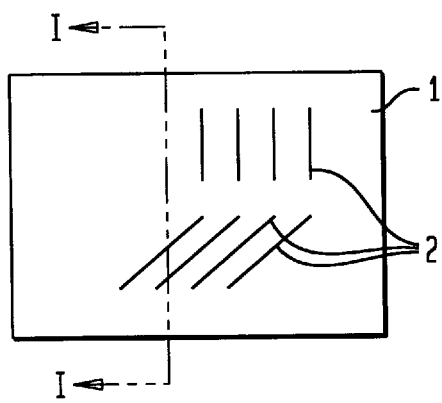
FIG. 1 is a top view of a circuit board according to the present invention.

Throughout all the Figures, the same or corresponding elements are always indicated by the same reference numerals.

Figure 2A:
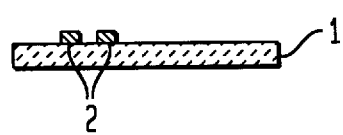
FIG. 2a is a sectional view of the circuit board taken along the line I—I in FIG. 1.

Turning now to the drawing, and in particular to FIG. 1, there is shown a top view of a basic configuration of a circuit board according to the present invention. The circuit board includes a substrate 1 of ceramic material which is cast with metal to form on its surface a metal layer from which conductive strips 2 are formed through locally stripping portions of the metal layer from the substrate surface. The local removal of metal layer can be carried out through photolithography, etching, burning off or laser treatment. As shown in FIG. 2a, which is a sectional view of the circuit board taken along the line I—I, it can be seen that the conductive strips 2 are raised relative to the surface of the substrate 1.

Figure 2B:
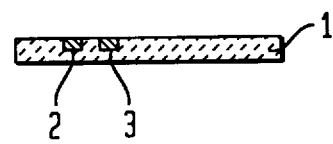
FIGS. 2b to 2e are sectional views of further variations of a circuit board according to the present invention.

FIG. 2b shows a sectional view of the variation of a circuit board according to the invention, in which the conductive strips 2 are provided in grooved depressions 3 of the surface of the substrate 1. The depressions or grooves 3 are formed in the surface of the substrate 1 according to a desired path of the conductive strips 2, and subsequently the substrate 1 is cast with metal that is selected as material for the conductive strips 2. The formed metal layer on the substrate 1 is then stripped away until metal is left only in the grooves 3, flush with the surface of the substrate 1.

Figure 2C:
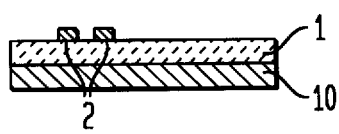
Figure 2D:
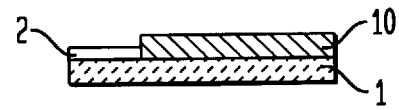
Figure 2E:
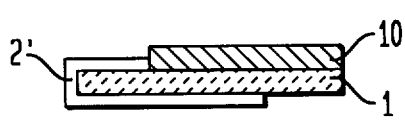

FIG. 2c shows a variation of a circuit board according to the invention in which the substrate 1 is bonded to a structural member 10 of metal matrix composite material (MMC) which additionally may also include in part pure metal. The surface of the substrate 1 is provided with raised conductive strips 2 which are formed as described with reference to FIGS. 1 and 2a. It is however also possible to provide the conductive strips 2 in a manner as shown in FIG. 2b, i. e. in grooved depressions. The circuit board according to FIG. 2d differs from the circuit board of FIG. 2c by keeping one area of the substrate 1 free from the structural member 10 for formation of raised conductive strips 2. Again, instead of raised conductive strips 2, depressions may be formed on the surface of the substrate 1 to receive the metal filling for forming the conductive strips 2 as described with reference to FIG. 2b. FIG. 2e shows a variation in which the conductive strips 2 are routed around a lateral end of the substrate 1 towards the underside of the substrate 1.

Figure 3:
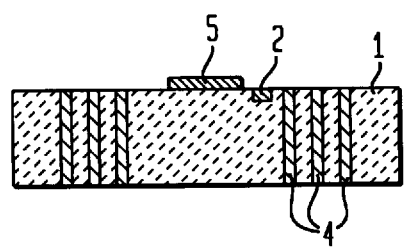
FIG. 3 is a sectional view of another embodiment of a circuit board according to the present invention for use as a chip casing.

Turning now to FIG. 3, there is shown a sectional view of another embodiment of a circuit board according to the present invention for use as chip casing, with the substrate 1 forming an electrically insulated base for a chip 5. The substrate 1 is provided with bores 4 to define vertical passageways extending from the underside to the top side of the substrate 1. The substrate 1 is made of non-porous, densely baked ceramic material. During casting with metal, the bores 4 are filled with metal and create a heat conducting and electrically conducting connection of both horizontal surfaces of the casing. In this manner, the heat absorption is increased, and stresses caused through temperature differences are avoided. In addition, a contact to the underside is created. The chip 5 is placed upon the top surface of the substrate 1, with the arrangement of the passageways 4 being such that the chip 5 is placed on an area of the substrate surface which is free of any bores 4. The conductive strips 2 are again formed in depressions in the top surface of the substrate 1 and filled with cast metal.

Figure 4:
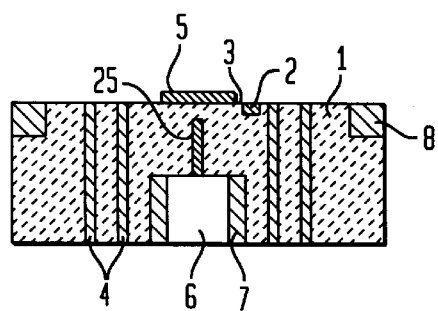
FIG. 4 is a sectional view of a variation of a circuit board according to the present invention for use as a chip casing.
Figure 5:
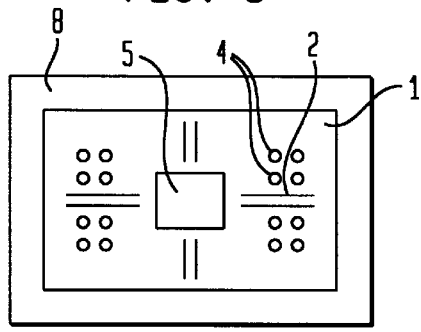
FIG. 5 is a top view of the circuit board of FIG. 4.

FIG. 4 shows a further embodiment of a circuit board in form of a chip casing, with the chip 5 being placed onto the top surface of the substrate 1. The chip-distant side of the substrate 1 is provided with a recess 6 for receiving a annular inlay 7 of MMC-material. Neighboring the inlay 7 are bores 4 for providing metal-filled passageways through the substrate 1. The MMC-inlay 7 is provided for absorbing heat developed by the chip and may be further provided with cooling channels for flow of a coolant to improve the cooling action, or may have surface structures e.g. in form of cooling ribs of the metal envelope which the MMC-material can extend into. Extending about the periphery of the substrate 1 is a circumferential step 8 which after being filled with metal during the casting process allows a mechanical connection, e.g. through welding, of the chip casing with a lid (not shown). As further shown in FIG. 4, the circuit board has conductive strips 2 received in respective depressions 3 and may have incorporated therein one or more internal metal bridges indicated by reference numeral 25 for absorbing heat generated by the chip 5. FIG. 5, which is a top view of the circuit board according to FIG. 4, shows the arrangement of the ends of the metal filled passageways 4, the conductive strips 2, the chip 5 and the circumferential step 8 for attachment of a lid through welding.

Figure 6:
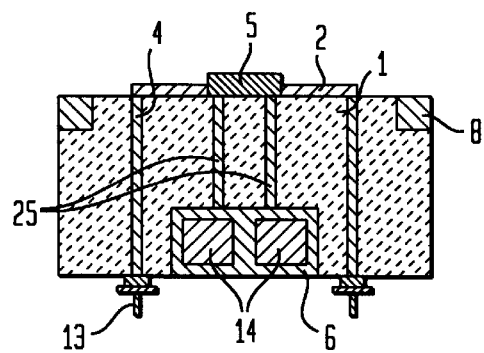
FIGS. 6 to 10 are sectional views of variations of a circuit board according to the present invention for use as a chip casing.

FIG. 6 shows a variation in which the substrate 1 supports the chip 5 on its top surface, with the chip 5 being electrically connected via cast conductive strips 2 and vertical metal-filled bores 4 with terminal pins 13 which are soldered onto the metal filled bores 4. Instead of the shown terminal pins 13, solder globules (ball grid arrays) may be provided. Thus, a thermal dissipation as well as a mutually insulating electrical connection is created between the terminal pins 13 and the chip 5, without requiring any complicated mechanical wiring elements. For absorbing heat generated by the chip 5, the circuit board may have incorporated therein one or more internal metal bridges indicated by reference numeral 25. At the chip-distant side, the substrate 1 includes a recess 6 which is filled with metal trough casting and contains MMC-components 14 for absorbing heat generated by the chip 5 and for compensating the thermal expansion of ceramics and metal. A step 8, filled with metal, serves again as connecting element for a not shown lid. The conductive strips 2 are of raised configuration and in electric communication with the metal filling in the bores 4. Certainly, the conductive strips 2 may also be received in respective depressions, as previously described.

The substrate 1 is made of ceramic material such as an oxide ceramics, carbide ceramics and/or nitrate ceramics e.g. aluminum oxide, aluminum nitrate or beryllium oxide. Examples for the infiltration metal include aluminum, iron, cobalt, silicon, copper, molybdenum or alloys thereof. The reinforcing component of the MMC-material includes an oxide ceramics, carbide ceramics and/or nitrate e.g. silicon carbide, aluminum nitrate, beryllium oxide, aluminum oxide, boron nitrate or carbon.

Figure 7:
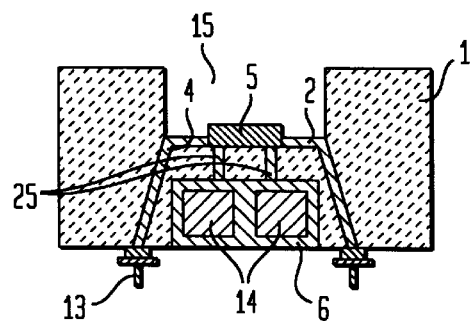

FIG. 7 shows a variation of a circuit board according to the invention in which the substrate 1 is provided on the side opposing the recess 6 with a recess 15 for receiving the chip 5. The recess 6 is configured in analog fashion as in FIG. 6 and receives a MMC-component 14 and is filled with casting metal or any other suitable metal. The metal-filled passageways 4 extend slantingly to electrically connect the terminal pins 13 via the conductive strips 2 with the chip 5. For absorbing heat generated by the chip 5, the circuit board may have incorporated therein one or more internal metal bridges indicated by reference numeral 25.

Figure 8:
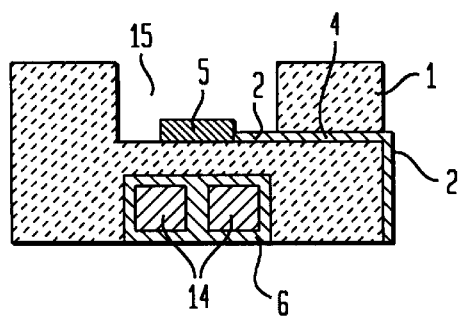

FIG. 8 shows a variation similar to the embodiment of the circuit board according to FIG. 7, with the difference residing in the provision of a bore 4 extending horizontally through the substrate 1 so that an electric connection is established from the chip 5 received in the recess 15 via a horizontal conductive strip 2 and a metal-filled bore 4 and via a vertical conductive strip 2 at one side of the substrate 1. Thus, the circuit board can be contacted from the side, e.g. in form of a "plug-in casing". The MMC-component 14 serves again to improve the heat absorption and thermal adjustment of ceramics and metal, and is received in the metal-filled recess 6.

Figure 9:
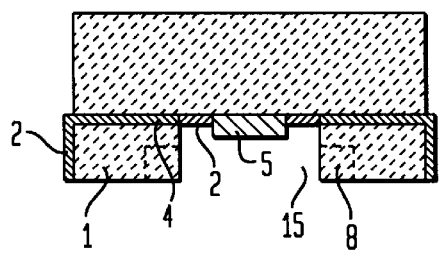

The number and arrangement of the passageways or bores 4 can be randomly selected. As shown for example in FIG. 9, the recess 15 is provided at the underside of the substrate 1 for receiving the chip 5, with the contacting towards the outside being effected via horizontal bores 4, which are filled with metal and continued along the side of the substrate 1 by vertical conductive strips 2. Indicated by broken line is a metal-filled step 8 for forming a downwardly directed connecting element.

Figure 10:
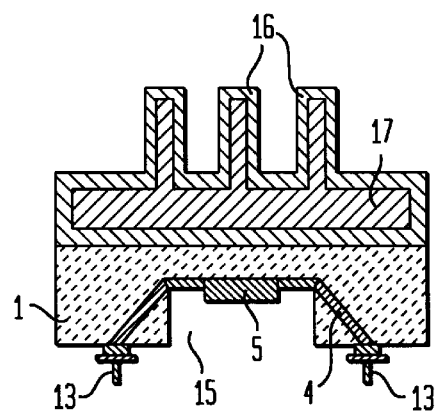

FIG. 10 shows a variation of the circuit board in which the substrate 1 is connected to a MMC-component 17 which is in heat conducting communication with cooling ribs 16 along one side for improving the heat absorption. The chip 5 is received in the recess 15 at the underside of the substrate 1 and electrically contacted via slanted metal-filled bores 4 with the terminal pins 13.

Figure 11:
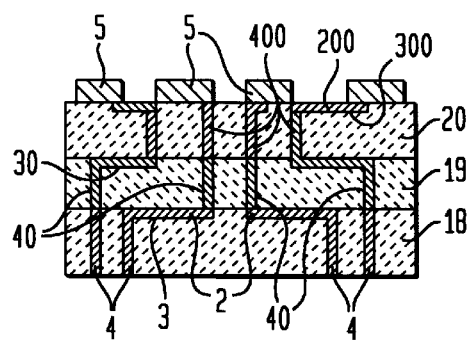
FIG. 11 is a sectional view of another embodiment of a circuit board according to the present invention for use as a multi-chip arrangement.

FIG. 11 is a sectional view of another embodiment of a circuit board according to the present invention, with the substrate 1 being multi-layered and with the tubular passageways 4 partially extending in the plane of the substrate 1 and partially vertically thereto. In the non-limiting example of FIG. 11, the substrate 1 includes three layers 18, 19, 20 in sandwich configuration which are applied subsequently in form of "green tapes". The first layer 18 of the substrate 1 is provided with vertical passageways 4, with their top surface being continued by conductive strips 2 received in grooved depressions 3 so that the outlet of a vertical passageway 4 leads into a horizontal depression 3 which then is continued by a further passageway 40 of the overlying layer 19. It is however also possible to extend a vertical passageway 4 in the layer 18 by a vertical passageway 40 in the overlying layer 19. After forming the passageways 4 and the depressions 3, the first layer 18 is cast with metal to fill the vertical passageways 4 and grooved depressions 3 with metal and to form an electric conduction in stepped configuration. Subsequently, the outer metal layer is stripped down so as to extend flush with the substrate surface, with metal remaining only in the depressions 3 to form the conductive strips 2. Then, the second layer 19 is attached and formed with vertical passageways 40 at suitable locations. The passageways 40 traverse the layer 19 in vertical direction. The top surface of the layer 19 is formed with depressions 30 and cast with metal. Then, the surface of the layer 19 is stripped to leave only metal within the passageways 40. The next layer 20 is also formed with passageways 400 and grooved depressions 300 and respectively prepared.

Thus, the multi-layer substrate 1 is provided in its interior with stepped electrical connections through several layers to eliminate an intersecting of a great number of connecting lines. The top surface of the layer 20 is provided with conductive strips 200 received in the depressions 300 which lead to a respective number of chips 5.

The steps can be realized in any desired manner. Also the number of layers of the ceramic 1 is not limited, and it is also possible to slant at least some of the passageways 4 with regard to the substrate 1, if desired.

The multi-chip arrangement according to FIG. 11 may also be produced by providing the individual "green tape" layers with depressions and passageways through embossing or stamping, and then to assemble the layers which then can be sintered together and cast with metal. Another variation includes the use of conventional metalized, multi-layer ceramics which is placed on a ceramic component provided with bores and then, this combination is sintered and cast with metal.

The method for making a circuit board or a chip casing according to the invention, thus includes the use of a ceramic substrate, which possibly together with a preform, is cast with metal to produce the conductive strips 2 by locally removing the metal layer from the surface of the substrate 1. The preform used in this context may be made of porous ceramic material or of a material used as reinforcing component of a metal matrix composite material so that the casting process results besides the surface metal layer also in the formation of a metal matrix composite. In addition, the structural member 10 of MMC material and/or metal may be attached to the substrate 1 and cast together with the porous ceramics or the reinforcement. Alternatively, it is also possible to cast only the substrate 1 with a structural member of MMC material and/or metal together.

While the invention has been illustrated and described as embodied in a circuit board, and method of making a circuit board, it is not intended to be limited to the details shown since various modifications and structural changes may be made without departing in any way from the spirit of the present invention.

What is claimed as new and desired to be protected by Letters Patent is set forth in the appended claims:

I claim:

1. A circuit board adapted for use as a casing for a chip, comprising:

a substrate made of ceramic material and having opposite surfaces, with one of the surfaces forming an electrically insulating base for the chip, and another of the surfaces having formed therein a first recess for receiving an inlay of metal matrix composite material, said substrate having cast metal-filled passageways extending between the surfaces; and conductive strips provided on the substrate in the form of cast metal layers.

2. The circuit board of claim 1 wherein the substrate has grooved depressions for receiving the conductive strips.

3. The circuit board of claim 1 wherein said substrate includes internal metal bridges for absorption of heat generated by the chip.

4. The circuit board of claim 1 wherein the passageways are tubular in shape.

5. The circuit board of claim 1 wherein the substrate includes a second recess for receiving the chip.

6. The circuit board of claim 5 wherein the inlay includes cooling channels for a coolant.

7. The circuit board of claim 6 wherein the inlay is surrounded by an envelope of metal, said envelope including additional cooling channels for a coolant.

8. The circuit board of claim 1 wherein the substrate is of multi-layer configuration and defines a surface plane, said passageways extending at least partially in the surface plane of the substrate.

9. The circuit board of claim 8 wherein the passageways extend partially vertical to the surface plane of the substrate.

10. The circuit board of claim 1 wherein the substrate is made of at least one material selected from the group consisting of oxide ceramics, carbide ceramics and nitride ceramics.

11. The circuit board of claim 1 wherein the substrate is made of a material selected from the group consisting of aluminum oxide, aluminum nitride and beryllium oxide.

12. The circuit board of claim 1 wherein the metal layers are made of a material selected from the group consisting of aluminum, iron, nickel, cobalt, silicon, copper, molybdenum and alloys thereof.

13. The circuit board of claim 1 wherein the metal matrix composite material includes a reinforcing component of at least one material selected from the group consisting of oxide ceramics, carbide ceramics and nitride ceramics.

14. The circuit board of claim 13 wherein the metal matrix composite material includes a reinforcing component of a material selected from the group consisting of silicon carbide, aluminum nitride, beryllium oxide, aluminum oxide, boron nitride and carbon.

15. The circuit board of claim 1 wherein the substrate has a groove which is filled with metal during casting for attachment of a lid.

16. A circuit board of a type including a substrate of ceramic material and having opposite surfaces, with one of the surfaces forming an electrically insulating base for the chip, and another of the surfaces having formed therein a recess for receiving an inlay of metal matrix composite material, said substrate having cast metal-filled passageways extending between the surfaces, and further including conductive strips provided on the substrate in the form of cast metal layers, used for protection of multi-chip modules.

* * * * *